US009520892B2

(12) United States Patent
Lee et al.

(10) Patent No.: US 9,520,892 B2
(45) Date of Patent: Dec. 13, 2016

(54) DIGITAL TO ANALOG CONVERTER, UNIT FOR THE SAME, AND METHOD FOR USING THE SAME

(71) Applicant: GWANGJU INSTITUTE OF SCIENCE AND TECHNOLOGY, Gwangju (KR)

(72) Inventors: Min-Jae Lee, Gwangju (KR); Seong-Geon Kim, Gwangju (KR); Jae-Hyun Kang, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 14/979,521

(22) Filed: Dec. 28, 2015

(65) Prior Publication Data

US 2016/0191033 A1    Jun. 30, 2016

(30) Foreign Application Priority Data

Dec. 29, 2014    (KR) ........................ 10-2014-0191948

(51) Int. Cl.
| | |
|---|---|
| H03K 5/14 | (2014.01) |
| H03K 3/356 | (2006.01) |
| H03M 1/66 | (2006.01) |
| H03M 1/06 | (2006.01) |

(52) U.S. Cl.
CPC ......... *H03M 1/66* (2013.01); *H03K 3/356121* (2013.01); *H03K 5/14* (2013.01); *H03M 1/0607* (2013.01)

(58) Field of Classification Search
None
See application file for complete search history.

(56) References Cited

U.S. PATENT DOCUMENTS

| | | | | |
|---|---|---|---|---|
| 7,042,379 | B2* | 5/2006 | Choe ................... | H03M 1/0881 341/144 |
| 8,031,098 | B1* | 10/2011 | Ebner ................. | H03M 1/1061 341/144 |
| 2007/0164884 | A1* | 7/2007 | Ihs .......................... | H03K 5/06 341/143 |
| 2011/0270427 | A1* | 11/2011 | Takahashi ............ | H03K 5/1565 700/94 |

OTHER PUBLICATIONS

Lin et al., "A Low-Spurious Low-Power 12-bit 300MS/s DAC with 0.1mm2 in 0.18 μm CMOS Process", IEEE Electron Devices and Solid-State Circuits Conf. (EDSSC), 2013, pp. 1-2.

(Continued)

*Primary Examiner* — Howard Williams
(74) *Attorney, Agent, or Firm* — Hauptman Ham, LLP

(57) ABSTRACT

Disclosed herein is a digital-to-analog converter (DAC) including a clock driver for controlling a clock signal to provide an inverse delay clock signal to allow at least selective adjustment of a return to zero (RZ) section; and a DAC core comprising at least two DAC units for receiving a digital input value, the clock signal and the inverse delay clock signal and providing an analog output value. According to the present invention, distortion of the output of the DAC may be attenuated and loss of the output may be minimized by utilizing the RZ technique.

15 Claims, 13 Drawing Sheets

(56) References Cited

OTHER PUBLICATIONS

Chi et al., "A 1.8-V 12-Bit 250-MS/s 25-mW Self-calibrated DAC", in Proc. IEEE Eur. Solid-State Circuits Conf. (ESSCIRC), 2010, pp. 222-225.
Engel et al., "A 14b 3/6GHz Current-Steering RF DAC in 0.18 µm CMOS with 66dB ACLR at 2.9GHz", in IEEE International Solid-State Circuits Conference, Dig. Tech. Papers, Feb. 22, 2012, pp. 458-460.
Tseng et al., "A 12-Bit 1.25-GS/s DAC in 90nm CMOS With > 70dB SFDR up to 500MHz", IEEE Journal of Solid-State Circuits, Dec. 2011, pp. 2845-2856, vol. 46, No. 12.
Lin et al., "A 12-bit 40 nm DAC Achieving SFDR > 70 dB at 1.6 GS/s and IMD < -61 dB at 2.8 GS/s With DEMDRZ Technique", IEEE Journal of Solid-State Circuits, Mar. 2014, pp. 708-717, vol. 49, No. 3.
Kim et al., (partial title) DAC Using Controllable RZ Window, [Supportive Materials for Exception to Loss of Novelty] Published at 2014 IEEE Asian Solid-State Circuits Conference on Nov. 10, 2014, 25 pages.

\* cited by examiner

Fig. 11

TABLE 1.
Comparison of state-of-the-art CMOS DACs

| | This work | Comparative Example 1 | Comparative Example 2 | Comparative Example 3 | Comparative Example 4 | Comparative Example 5 |
|---|---|---|---|---|---|---|
| Tech | 0.11 μm | 0.18 μm | 0.18 μm | 0.18 μm | 90 nm | 40 nm |
| Core area [mm$^2$] | 0.117 | 0.1 | 0.8 | 4 | 0.825 | 0.016 |
| Resolution [bit] | 12 | 12 | 12 | 14 | 12 | 12 |
| Power [mW] | 28/40 | 35 | 25 | < 600$^a$ | 128 | 40 |
| Supply [V] Analog | 2.5/3.3 | - | 1.8/1.9 | 3 | 2.5 | 1.2 |
| Supply [V] Digital | 2.5 | - | 1.8 | 1.8 | 1.2 | 1.2 |
| ILoad [mA] | 2.5/5 | 6 | 10 | 20 | 16 | 16 |
| Fs [GS/s] | 0.25 (limited by sine generator) | 0.3 | 0.25 | 3 | 1.25 | 1.6 |
| Vswing,pp [V] | 0.25-2 | - | - | 1 | 0.8 | 0.8 |
| SFDRBest [dB] | 75.32$^b$/76.92$^c$ | 72.9 | 71.7 | 84.0 | 75.0 | 74.0 |
| SFDRWorst [dB] | 71.73$^b$/72.11$^c$ | 70.3 | 43.0 | 55.0 | 66.0 | 70.3 |
| BW70dB (MHz) | 125 | 150 | 1 | 350 | 500 | 890 |
| FoM$_1$ (10$^5$ × GHz/mW) | 14.00$^b$/10.1$^c$ | 8.43 | 3.82 | 2.12 | 7.34 | 44.3 |
| FoM$_2$ (10$^5$ × MHz/mW) | 1.83$^b$/1.26$^c$ | 1.76 | 1.61 | 0.96 | 1.83 | 8.19 |
| FoM$_3$ (10$^5$ × MHz/mW) | 14.50$^b$/10.36$^c$ | - | - | - | 0.19 | 16.07 |
| Signal power loss [dB] | 0.95 | - | - | - | > 6.02 | > 6.02 |
| Device type of current source and switch | PMOS | NMOS | PMOS | NMOS | NMOS | NMOS |
| RZ | O | X | X | O | O | O |
| DEM | O | O | X | X | X | O |
| Calibration | X | X | O | X | O | X |

$^a$600mW@5GHz, $^b$0.5 V$_{swing,pp}$, $^c$2 V$_{swing,pp}$

| FoM$_1$ [5] | $\dfrac{2^{ENOB_{Best}} \times 2^{ENOB_{Worst}} \times F_s}{\text{Power} - 0.5 \times I_{Load}^2 \times R_{Load}}$ |
|---|---|
| FoM$_2$ [5] | $\dfrac{2^N \times BW_{70dB}}{\text{Power}}$ |

DIGITAL TO ANALOG CONVERTER, UNIT FOR THE SAME, AND METHOD FOR USING THE SAME

CROSS-REFERENCE TO RELATED APPLICATIONS

This application claims the priority of Korean Patent Application No. KR 10-2014-0191948 filed on Dec. 29, 2014, in the Korean Intellectual Property Office, the disclosure of which is incorporated herein by reference.

BACKGROUND

1. Technical Field

The present invention relates to a digital-to-analog converter for converting a digital signal into an analog signal.

2. Description of the Related Art

A digital-to-analog converter (DAC) is needed to process a product through a digital internal processing technique to produce an analog signal for communication, sound and the like. The DAC is a device for converting a coded digital signal into an analog signal.

The DAC has code dependent transient. The code dependent transient refers to a phenomenon that occurs when an output value differs from an input value according to each input code as the input value passes through the DAC. This is because an output value of the DAC for one input code affects an output value of the DAC for the next input code. The code dependent transient increases a harmonic component of the output value, thereby adversely affecting performance of the DAC. The harmonic component is measured based on spurious free dynamic range (SFDR), which indicates a difference between the signal strength of an output frequency f and the signal strength of frequency 2f of the harmonic component. If the SFDR is high, this may mean that the harmonic component is small and performance of the DAC is high.

As a method to attenuate the code dependent transient, a return to zero (RZ) technique is used. The RZ is a technique of forcibly converting half the input value to the DAC into 0 to prevent one input code from affecting the next input code (hereinafter, referred to as an input value).

However, since the RZ sets a section corresponding to half the input value to 0, it produces signal loss of about 6 dB in the output value. That is, in the RZ section, the input value is 0 and is thus not used. Accordingly, the output value correspondingly decreases. This results in waste of usable resources and requires separate amplification of the output value to compensate loss of the output value.

BRIEF SUMMARY

It is an aspect of the present invention to provide a digital-to-analog converter for minimizing loss of the output while using the RZ technique, a unit for the same, and a method for using the same.

In accordance with one aspect of the present invention, a digital-to-analog converter (DAC) includes a clock driver for controlling a clock signal to provide an inverse delay clock signal to allow at least selective adjustment of a return to zero (RZ) section; and a DAC core comprising at least two DAC units for receiving a digital input value, the clock signal and the inverse delay clock signal and providing an analog output value.

Herein, the clock driver may adjust enablement and disablement of RZ. The DAC core may include an RZ flip-flop for outputting 0 as a flip-flop output signal and an inverse flip-flop output signal such that the RZ section is established when both the clock signal and the inverse delay clock signal are 1; a switch driver for outputting 0 as a reset signal when both the flip-flop output signal and the inverse flip-flop output signal are 0; and an output unit comprising an RZ signal switch unit and an output signal switch unit, the RZ signal switch unit setting an output value to 0 in a section having the reset signal equal to 0 and the output signal switch unit providing a positive or negative output value in a section having the reset signal unequal to 0. The RZ section may be adjusted by a signal constituted in 4 bits. The digital input value is obtained by converting an original digital input value through a dynamic element matching (DEM) circuit, wherein the DEM circuit is preferably adjustable to be turned on and off.

In accordance with another aspect of the present invention, a digital-to-analog converter (DAC) unit includes a return to zero (RZ) flip-flop for receiving a clock signal and an inverse delay clock signal delayed by an RZ section by converting the clock signal and outputting 0 as a flip-flop output signal and an inverse flip-flop output signal in the RZ section; a switch driver for outputting 0 as a reset signal when both the flip-flop output signal and the inverse flip-flop output signal are 0; and an output unit for outputting an output value of 0 in a section having the reset signal equal to 0 and outputting a positive or negative output value in a section having the reset signal unequal to 0.

Preferably, the RZ flip-flop is configured as hardware.

In addition, the RZ flip-flop includes a sense amplifier for outputting, when the clock signal corresponds to a rising edge, logic values of a digital input value and an inverse digital input value as a reset set signal and a sensing set signal and maintaining the logic values until a rising edge of a next clock signal appears; and an RZ latch for outputting 0 as the flip-flop output signal and the inverse flip-flop output signal when the clock signal and the inverse delay clock signal are 1, and outputting, when any one of the clock signal and the inverse delay clock signal is not 1, the flip-flop output signal and the inverse flip-flop output signal such that the flip-flop output signal complies with a value of the reset set signal, and the inverse flip-flop output signal complies with a value of the sensing set signal. Preferably, the switch driver includes an inverter for inverting the flip-flop output signal and the inverse flip-flop output signal and outputting final switch pair input data and inverse final switch pair input data.

Preferably, the switch driver includes two reset switches having a power supply as a source, having the final switch pair input data and the inverse final switch pair input data as gates thereof, and having a reset signal output terminal for outputting the reset signal connected to a drain.

Preferably, the DAC unit further includes an RZ switch unit for outputting an output value of 0 in a section having the reset signal equal to 0; and an output signal switch unit for outputting a positive or negative output value in a section having the reset signal unequal to 0.

Preferably, the RZ switch unit and the output signal switch unit may be connected in parallel.

In accordance with another aspect of the present invention, a method for using a digital-to-analog converter (DAC) includes adjusting return to zero (RZ); selecting an optimum RZ section through adjustment of the RZ; and applying the optimum RZ section and operating the DAC.

Preferably, the RZ section is changeable.

The RZ may not be performed.

According to embodiments of the present invention, distortion of the output of the DAC may be attenuated and loss of the output may be minimized by utilizing the RZ technique.

BRIEF DESCRIPTION OF THE DRAWINGS

FIGS. 8 and 9 are diagrams illustrating operation of an output unit, in wherein FIG. 8 illustrates an operation of an output signal switch performed when a positive or negative output value is output, and FIG. 9 illustrates operation of an RZ signal switch performed when the output value is 0 in the RZ section.

FIG. 11 is a table for comparing performances of DACs of comparative examples and an embodiment.

DETAILED DESCRIPTION

Hereinafter, embodiments of the present invention will be described in detail with reference to the accompanying drawings. It should be understood that the present invention is not limited to the following embodiments, and that the embodiments are provided for illustrative purposes only. The scope of the invention should be defined only by the accompanying claims and equivalents thereof.

Figure 1:
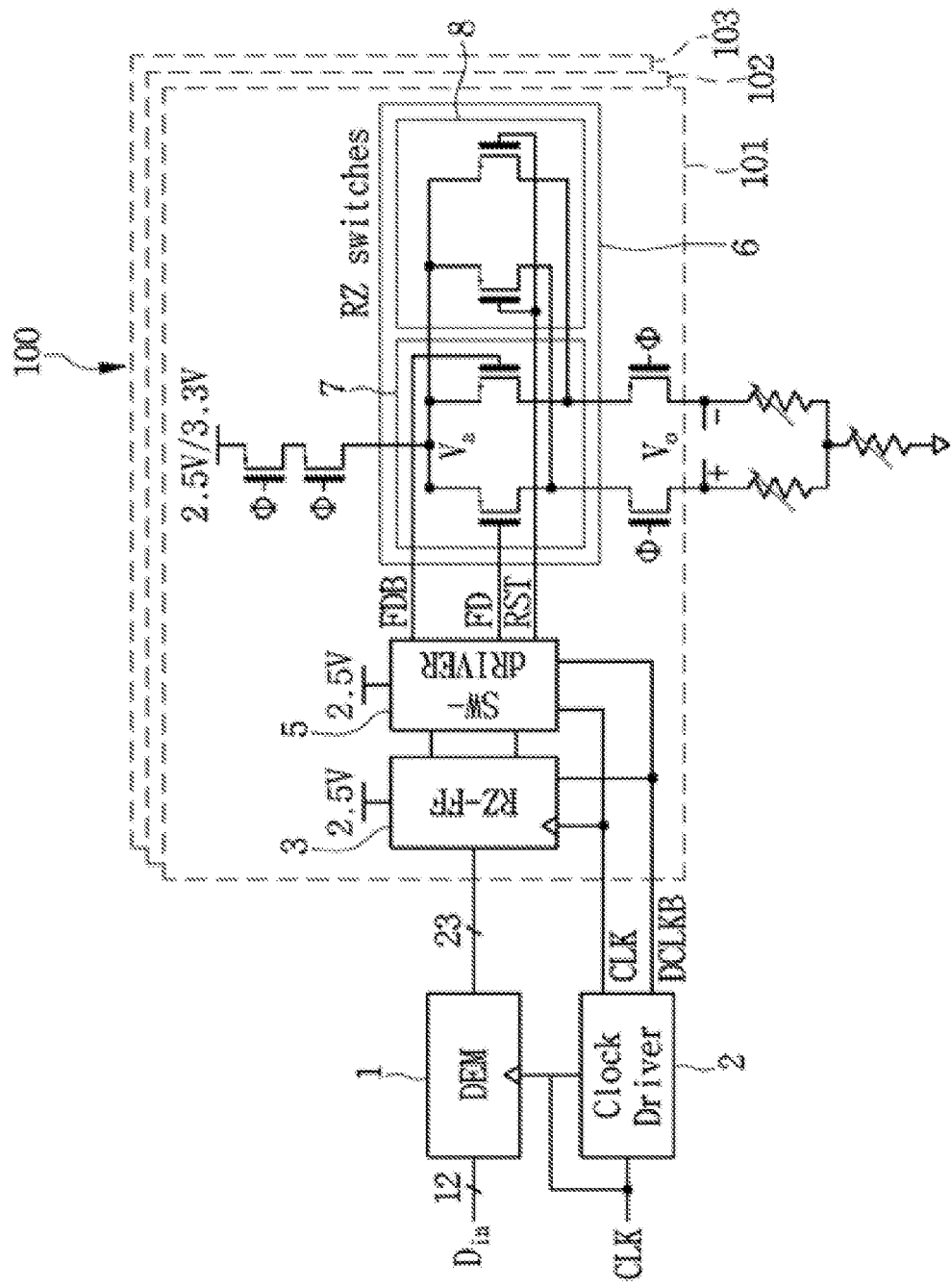
FIG. 1 is a diagram illustrating configuration of a DAC according to an embodiment.

FIG. 1 is a diagram illustrating configuration of a DAC according to an embodiment.

Referring to FIG. 1, the DAC includes a DAC core 100, which includes at least two DAC units 101, 102 and 103, a dynamic element matching circuit (DEM circuit) 1 for converting an input value Din and supplying the converted value to the DAC core, and a clock driver 2 for inputting a clock by converting the clock. The DEM circuit 1 and the clock driver 2 set RZ by adjusting the input value Din, and determine an operation mode of the DAC by setting whether or not to perform DEM.

Specifically, the DEM circuit 1 increases the number of bits of an input signal and randomly supplies the signal to the DAC units, thereby attenuating current mismatching. For example, the DEM circuit 1 may increase the number of bits from 12 to 23. The function of the DEM circuit 1 may be selectively enabled/disabled. The clock driver 2 may control clocks to determine enablement or disablement of the RZ and the RZ section.

While the figure illustrates that three DAC units 101, 102 and 103 are provided, embodiments are not limited thereto. At least two DAC units may be provided. Accordingly, analog values output from the respective units are summed to provide an analog signal as an output value.

Hereinafter, operation of one of the DAC units will be briefly described. However, description of one of the DAC units given below is similarly applicable to the other DAC units.

The RZ flip-flop 3 receives a clock signal (CLK), an inverse delay clock signal (DCLKB), a digital input value D and an inverse digital input value Db, and provides output values as a flip-flop output signal Q and an inverse flip-flop output signal Qb. As well known in the art, the flip-flop, as an electric circuit called a latch, stores information of at least one bit and maintain the corresponding value until the next clock appears. In this embodiment, the RZ flip-flop 3 may output a flip-flop output signal Q and an inverse flip-flop output signal Qb such that the RZ function is performed when the values of the clock signal (CLK) and the inverse delay clock signal (DCLKB) are all 1.

A switch driver 5 provides a reset signal Rst as a switching signal of RZ. In addition, the switch driver 5 inverts the flip-flop output signal Q and the inverse flip-flop output signal Qb to provide final switch pair input data FD and final inverse switch pair input data FDB to drive a PMOS which is a semiconductor.

An output unit 6 receives the reset signal Rst, the final switch pair input data FD, and the inverse final switch pair input data FDB, and provides an analog signal. The output unit 6 includes an output signal switch unit 7 and an RZ signal switch unit 8. The output signal switch unit 7 receives the final switch pair input data FD and the inverse final switch pair input data FDB and provides an analog signal which is a positive current or negative current as an output signal. The RZ signal switch unit 8 receives the reset signal Rst and set the output signal to 0. Accordingly, the output signal is 0 in the predetermined RZ section, and an analog signal having a positive value or a negative value may be provided as the output signal in the other sections. An output value from one DAC unit is summed with output values from the other DAC units. Thereby, an output value from one DAC may be provided.

Hereinafter, constituents of a DAC will be described.

Figure 2:
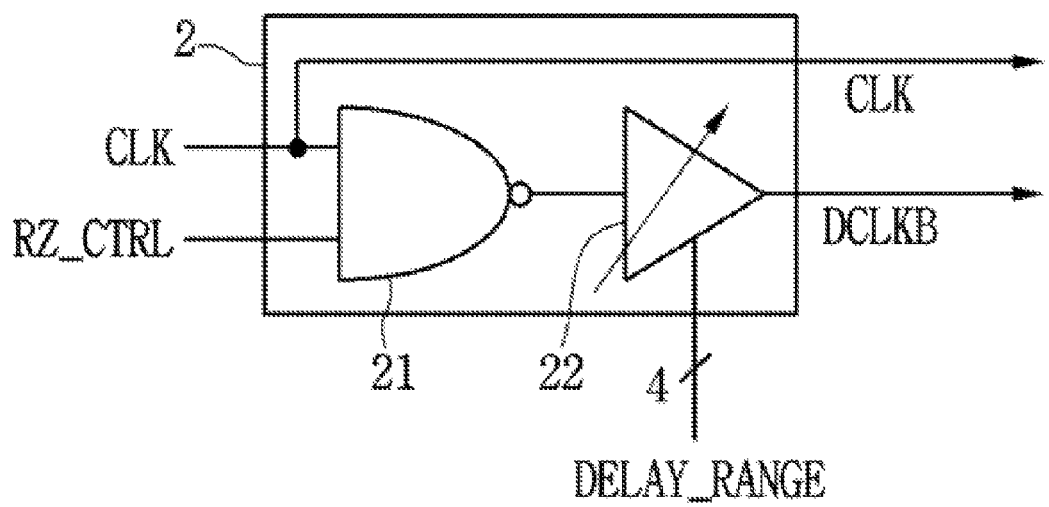
FIG. 2 is a diagram illustrating specific configuration of a clock driver.

FIG. 2 is a diagram illustrating specific configuration of a clock driver.

Referring to FIG. 2, the clock driver 2 includes an RZ controller 21, to which a clock signal (CLK) and an RZ control signal (RZ_CTRL) are input, and a delay controller 22 for receiving the output signal of the RZ controller 21 and a delay adjustment signal (DELAY_RANGE) and providing an inverse delay clock signal (DCLKB).

More specifically, the RZ controller 21 may be provided as a NAND gate. Thereby, RZ is not allowed to be performed when the RZ control signal (RZ_CTRL) is 0, and is allowed to be performed when the RZ control signal is 1. That is, the RZ controller 21 may determine whether or not to perform RZ. The delay controller 22 may receive the delay adjustment signal (DELAY_RANGE) and the output signal of the RZ controller 21, and provide an inverse delay clock signal (DCLKB). Thereby, the delay controller 22 may determine the RZ section and provide an output signal. The delay adjustment signal (DELAY_RANGE) may be configured in 4 bits to determine a desired RZ section. For example, RZ section may be variably adjusted in the range between 450 ps and 1 ns. The clock driver 2 also outputs a clock signal (CLK).

In brief, a clock signal (CLK) and an inverse delay clock signal (DCLKB) may be output from the clock driver 2, and the RZ section may be determined by comparing the inverse delay clock signal (DCLKB) with the clock signal (CLK).

Figure 3:
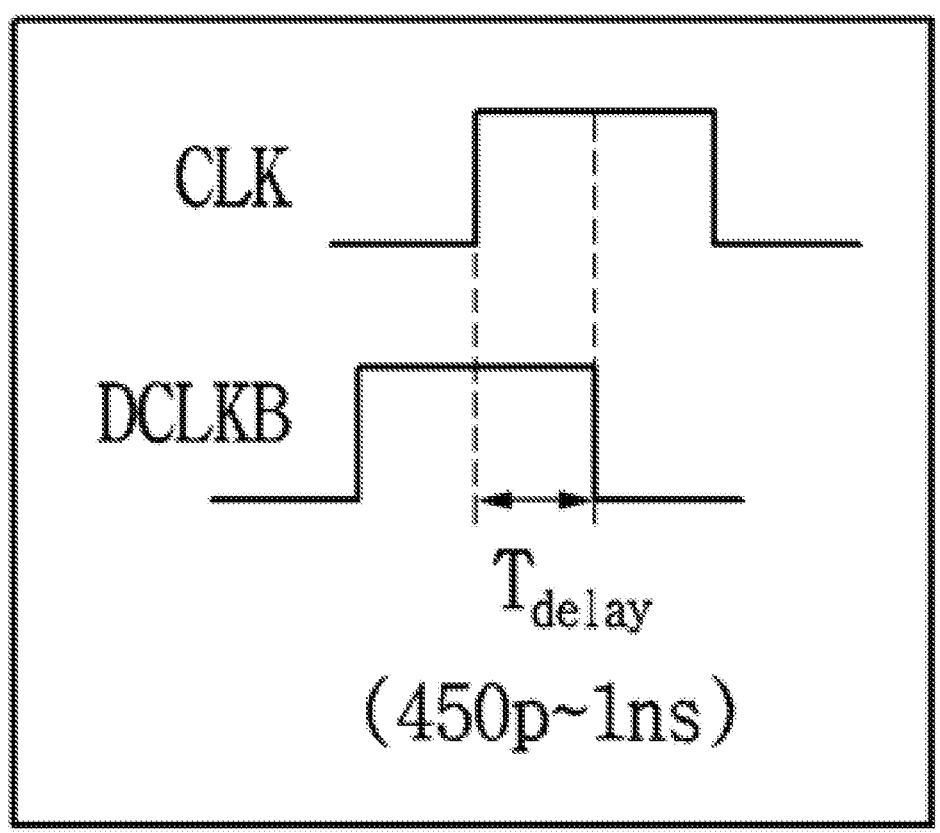
FIG. 3 is a diagram comparing a clock signal (CLK) and an inverse delay clock signal (DCLKB).

FIG. 3 is a diagram comparing a clock signal (CLK) and an inverse delay clock signal (DCLKB). Referring to FIG. 3, the inverse delay clock signal (DCLKB) comes before the clock signal (CLK). As will be described in detail later, the section in which both the clock signal (CLK) and the inverse delay clock signal (DCLKB) are 1 is an RZ section. As described above, the RZ section is conventionally determined to correspond to 50% of the input value. Thereby, loss of 6 dB is produced in the output value. If the RZ section is excessively downsized, the RZ effect may not be obtained due to, for example, signal delay. Therefore, it is an important challenge to determine an RZ section which maximizes the RZ effect while minimizing loss of the output value. A method to address this challenge will be described in detail later.

Figure 4:
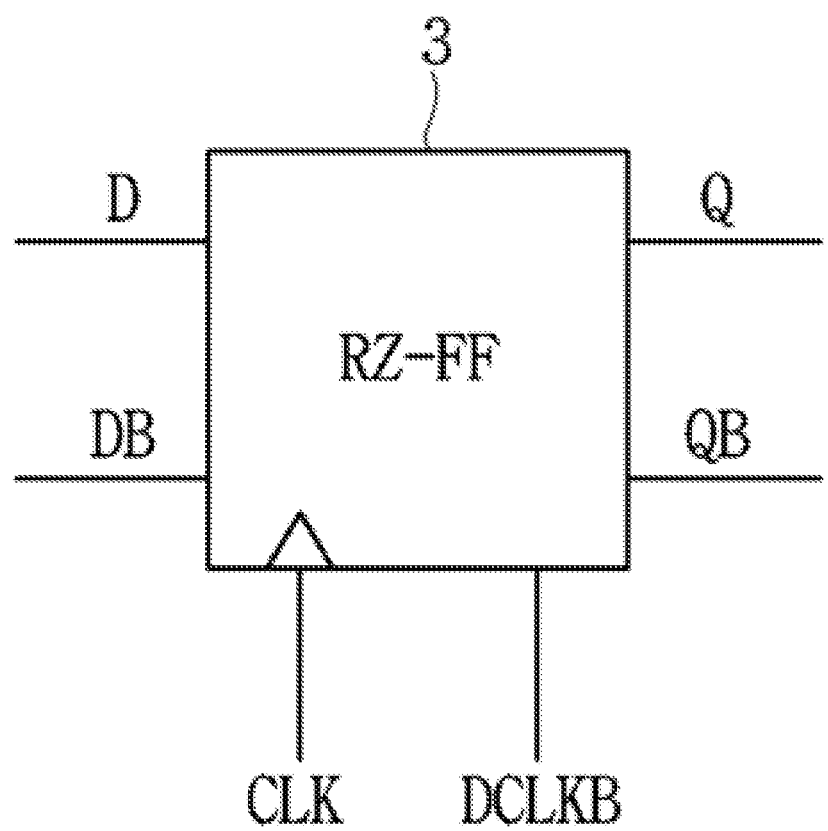
FIG. 4 is a schematic diagram illustrating configuration of an RZ flip-flop.
Figure 5:
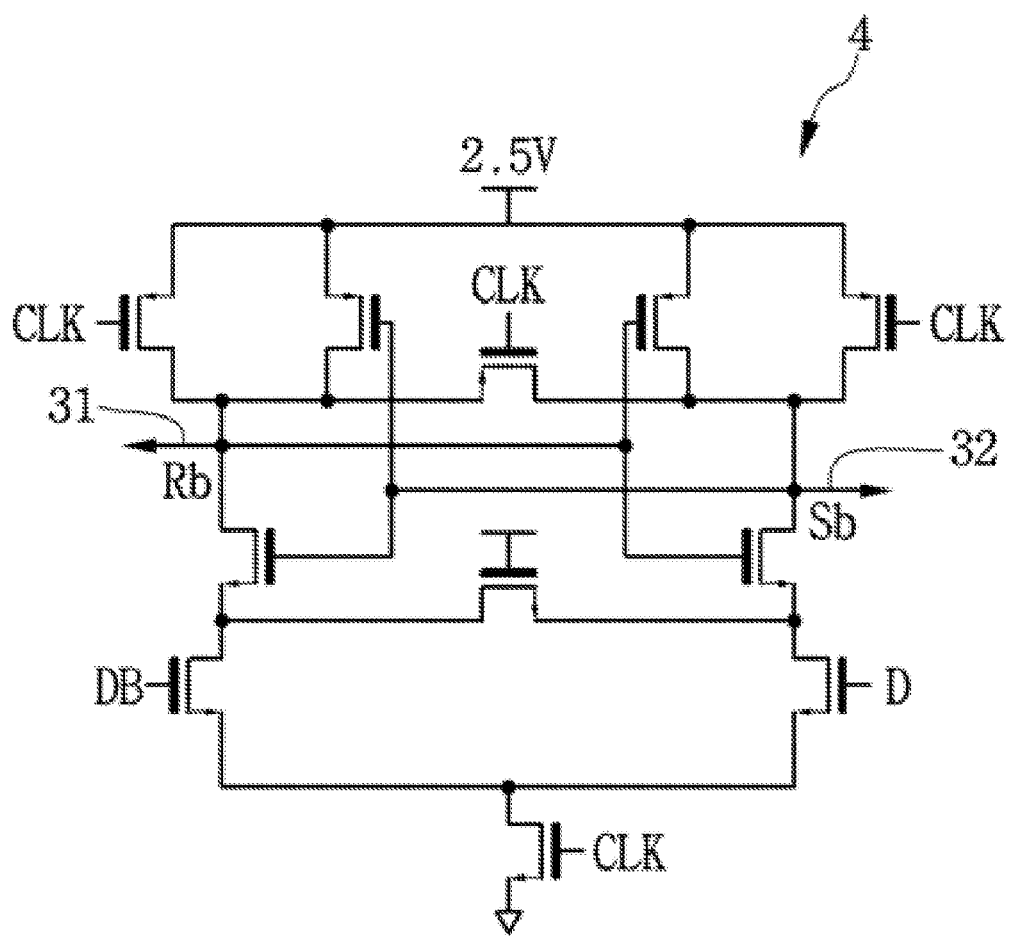
FIG. 5 is a diagram illustrating a sense amplifier constituting the RZ flip-flop.
Figure 6:
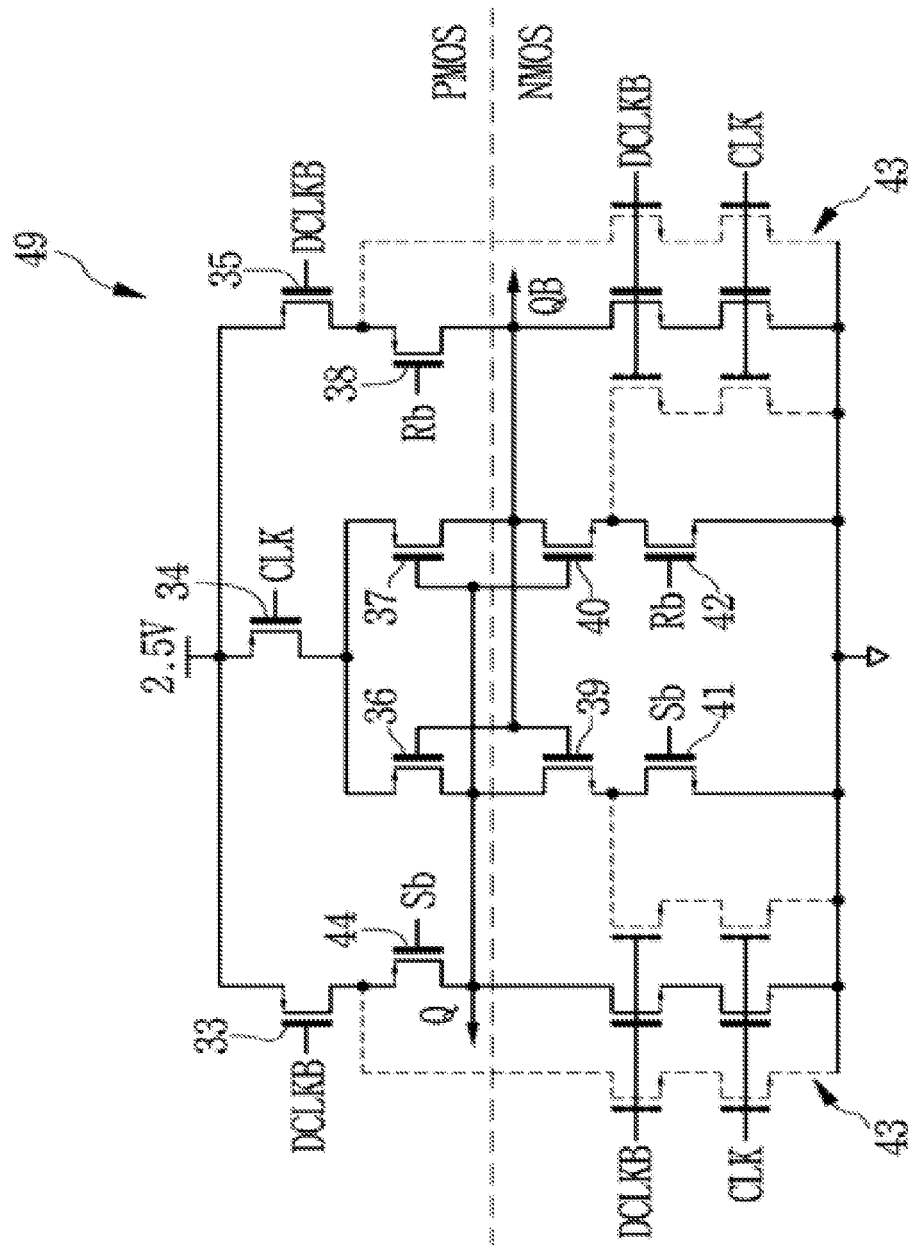
FIG. 6 is a diagram illustrating an RZ latch constituting the RZ flip-flop.

FIG. 4 is a schematic diagram illustrating configuration of an RZ flip-flop, FIG. 5 is a diagram illustrating a sense amplifier constituting the RZ flip-flop, and FIG. 6 is a diagram illustrating an RZ latch constituting the RZ flip-flop.

Referring to FIGS. 4 to 6, the RZ flip-flop 3 performs a control operation to output a flip-flop output signal (Q) and an inverse flip-flop output signal (Qb) such that the RZ function is performed when both the clock signal (CLK) and the inverse delay clock signal (DCLKB) are all 1.

To this end, the sense amplifier amplifies a current signal to a logic level and outputs the amplified signal, as well known in the art. In this embodiment, when the clock signal (CLK) corresponds to a rising edge, the sense amplifier is used to read a digital input value (D) and an inverse digital input value (Db) and to output a reset set signal (Rb) and a sensing set signal (Sb) as logic values. The values of the respective signals are exemplarily illustrated in the timing diagram of FIG. 12. Hereinafter, the timing diagrams of respective signals may refer to FIG. 12 unless stated otherwise. The sense amplifier 4 of FIG. 5 may receive the clock signal (CLK), the digital input value (D) and the inverse digital input value (Db), and then output the reset set signal (Rb) through a reset set signal output terminal 31 and the sensing set signal (Sb) through a sensing set signal output terminal 32.

The sense amplifier shown in FIG. 5 is simply illustrative, and other sense amplifiers having a different circuit configuration may be employed. It is apparent that, when a clock signal (CLK) corresponds to a rising edge, the sense amplifier can be used to read a digital input value (D) and an inverse digital input value (Db), to output logic values thereof as a reset set signal (Rb) and a sensing set signal (Sb), and to maintain the logic values until the next clock signal (CLK) is provided.

An RZ latch 49 shown in FIG. 6 receives a clock signal (CLK), an inverse delay clock signal (DCLKB), a reset set signal (Rb), and a sensing set signal (Sb), and provides a flip-flop output signal (Q) and an inverse flip-flop output signal (Qb). The RZ latch 49 is configured as hardware using a MOS. If the RZ latch 49 is provided as software, code dependent transient is caused due to delay in signal processing. An example RZ latch configured as hardware to overcome the problem of delay in signal processing is shown in FIG. 6. In FIG. 6, a PMOS switch may be provided on the upper side with respect to the dotted line, and a NOMS switch may be provided on the lower side with respect to the dotted line.

Hereinafter, configuration of the RZ latch 49 will be described. First, the RZ latch 49 is provided with three switches connected in parallel and having a power terminal (2.5V) as a source. The RZ latch 49 includes a first P-switch 33 having an inverse delay clock signal (DCLKB) as a gate, a second P-switch 34 having a clock signal (CLK) as a gate, and a third P-switch 35 having a clock signal (DCLKB) as a gate. In addition, the RZ latch 49 includes a fourth P-switch 44 having the drain of the first P-switch 33 as a source and a sensing set signal (Sb) as a gate and a seventh P-switch 38 having the drain of the third P-switch 35 as a source and a reset set signal (Rb) as a gate. The drain of the second P-switch 34 is branched and supplied as a source of a fifth P-switch 36 and a source of a sixth P-switch 37. The drain of the fifth P-switch 36 is supplied as a source of a first N-switch 39, and the drain of the sixth P-switch 37 is supplied as a source of a second N-switch 40. In the configuration described above, the flip-flop output signal (Q) is connected with the drain of the fourth P-switch 44, the drain of the fifth P-switch 36, the source of the first N-switch 39, the gate of the sixth P-switch 37, and the gate of the second N-switch 40. The inverse flip-flop output signal (Qb) is connected with the drain of the seventh P-switch 38, the drain of the sixth P-switch 37, the source of the second N-switch 40, the gate of the fifth P-switch 36, and the gate of the first N-switch 39.

Meanwhile, the drain of the first N-switch 39 is connected to the source of a third N-switch 41. The third N-switch 41 has a sensing set signal (Sb) as the gate and the drain thereof is grounded. The drain of the second N-switch 40 is connected to the source of a fourth N-switch 42. The fourth N-switch 42 has a reset set signal (Rb) as the gate and the drain thereof is grounded. The ground terminal is provided with a current stabilization unit 43, which has a clock signal (CLK) and an inverse delay clock signal (DCLKB) as the gate. Thereby, the flip-flop output signal (Q) and the inverse flip-flop output signal (Qb) may obtain ideal output values more quickly.

Hereinafter, operation of an SR latch will be described as an example.

Figure 12:
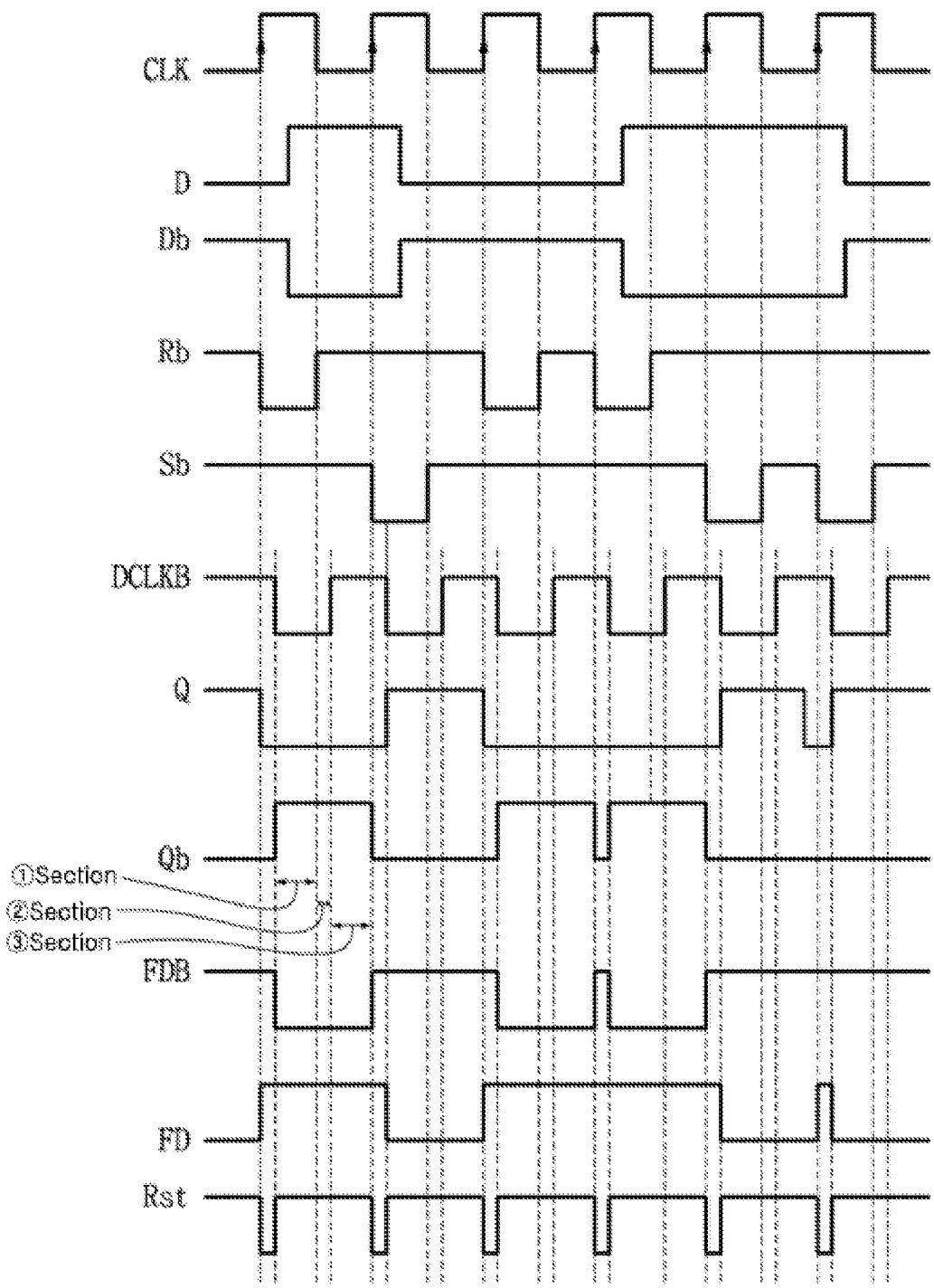
FIG. 12 is a timing diagram of the DAC.

Referring to FIG. 12, in Section 1 of the inverse flip-flop output signal (Qb), the clock signal (CLK) is 1, the inverse delay clock signal (DCLKB) is 0, the reset set signal (Rb) is 0, and the sensing set signal (Sb) is 1. In this case, the second P-switch 34 is turned off, the third P-switch 35 is turned on, and the seventh P-switch 38 is turned on. Accordingly, the inverse flip-flop output signal (Qb) may be 1. Subsequently, in Section 2 of the inverse flip-flop output signal (Qb), the clock signal (CLK) is 0, the inverse delay clock signal (DCLKB) is 0, the reset set signal (Rb) is 1, and the sensing set signal (Sb) is 1. In this case, the second P-switch 34 is turned on, the third P-switch 35 is turned on, the seventh P-switch 38 is turned off, and the fourth P-switch 44 is turned off. Accordingly, the sixth P-switch 37 is turned on. Therefore, the inverse flip-flop output signal (Qb) may be 1. Subsequently, in Section 3 of the inverse flip-flop output signal (Qb), the clock signal (CLK) is 0, the inverse delay clock signal (DCLKB) is 1, the reset set signal (Rb) is 1, and the sensing set signal (Sb) is 1. In this case, the second P-switch 34 is turned on, the third P-switch 35 is turned off, the seventh P-switch 38 is turned off, the fourth P-switch 44 is turned on, and the first P-switch 33 is turned off. Accordingly, the sixth P-switch 37 is turned on. Therefore, the inverse flip-flop output signal (Qb) may be 1.

Regarding output of the RZ latch, in the other sections, the RZ latch may also operate according to timing of the respective signals as described above.

The operation of the RZ latch may be summarized as follows. First, if the clock signal (CLK) and the inverse delay clock signal (DCLKB) are 1, both the flip-flop output signal (Q) and the inverse flip-flop output signal (Qb)

become 0 such that the corresponding section becomes the RZ section. Second, if any one of the clock signal (CLK) and the inverse delay clock signal (DCLKB) is 1, the flip-flop output signal (Q) depends on the value of the reset set signal (Rb), and the inverse flip-flop output signal (Qb) depends on the value of the sensing set signal (Sb). Herein, it should be noted that when the clock signal (CLK) and the inverse delay clock signal (DCLKB) are 1, the corresponding section is designated as the RZ section. Accordingly, in this section, both the flip-flop output signal (Q) and the inverse flip-flop output signal (Qb) are set to 0 to implement the RZ section.

The hardware may have various different configurations, but the basic operation described above is preferably implemented in any configuration.

Figure 7:
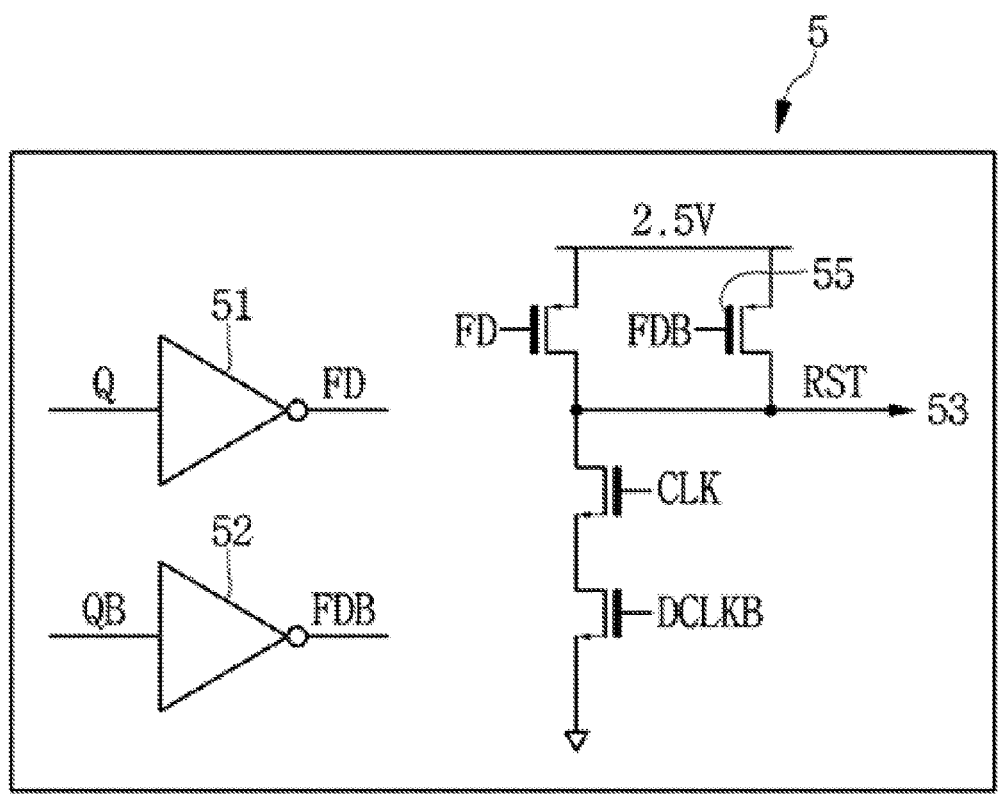
FIG. 7 is a diagram illustrating a switch driver.

FIG. 7 is a diagram illustrating a switch driver.

Referring to FIG. 7, the switch driver includes inverters 51 and 52. The inverters 51 and 52 invert the flip-flop output signal (Q) and the inverse flip-flop output signal (Qb) into final switch pair input data FD and inverse final switch pair input data FDB. This is because a transistor included in the subsequent circuit configuration is configured by a PMOS as a p-type transistor. Accordingly, given a different configuration for the MOS, the inverter may not be necessary.

A circuit configuration for providing a reset signal Rst is also provided. Specifically, this circuit configuration includes a first reset switch 54 and a second reset switch 55 having the power terminal (2.5V) as a source and constructed by a PMOS. The first and second reset switches 54 and 55 have the final switch pair input data FD and the inverse final switch pair input data FDB as the gates thereof, and the drains thereof are connected to a reset signal output terminal 53. According to the aforementioned configuration, only if both the final switch pair input data FD and the inverse final switch pair input data FDB are 1, the reset signal Rst outputs 0. Otherwise, the reset signal Rst outputs 1. It can be seen that the section in which the reset signal Rst is 0 is an RZ section.

Figure 8:
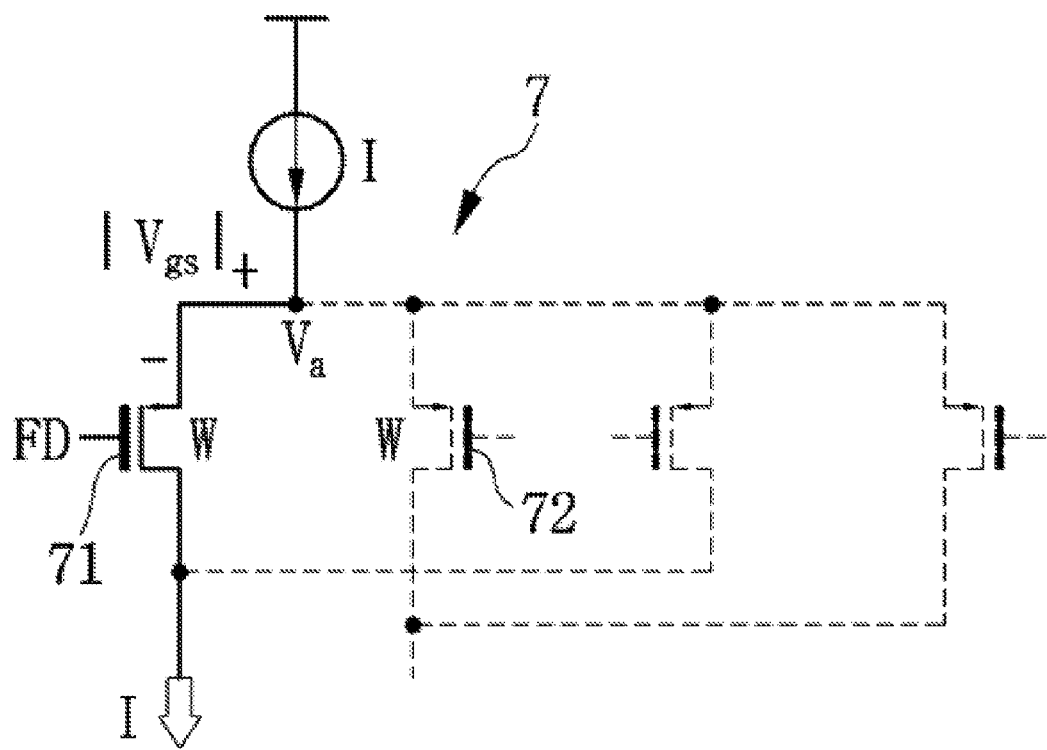
Figure 9:
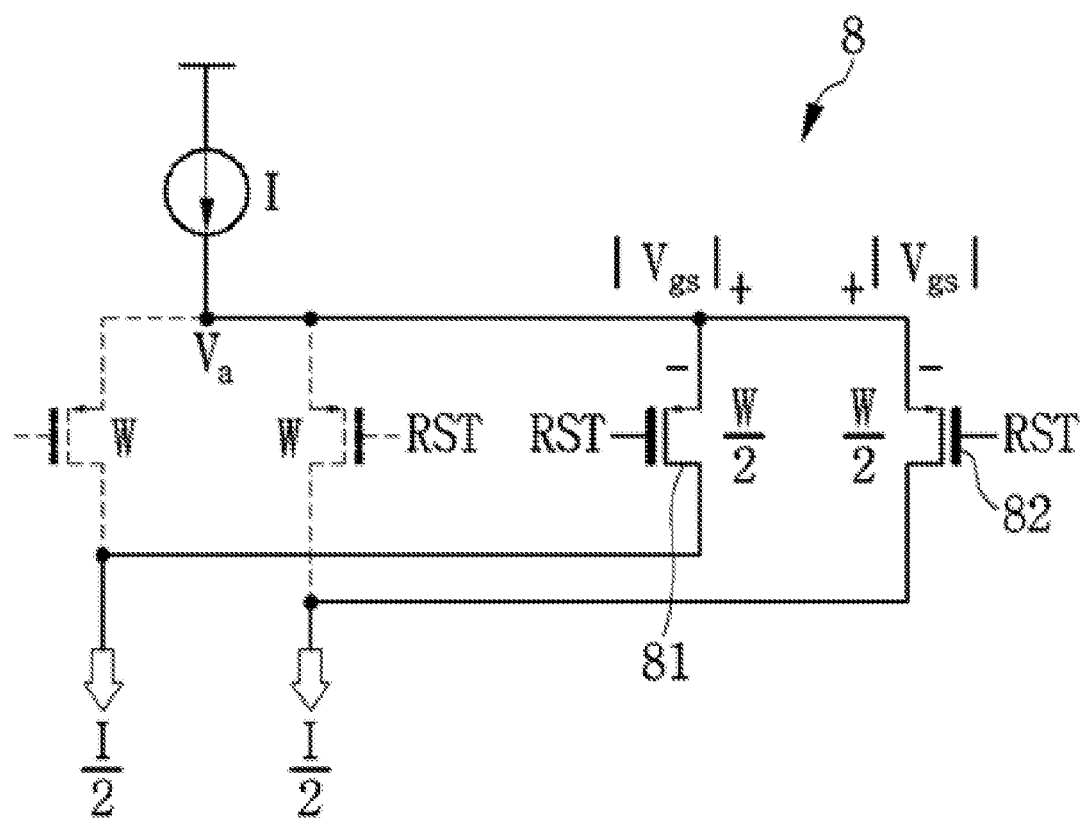

FIGS. 8 and 9 are diagrams illustrating operation of an output unit. FIG. 8 illustrates an operation of the output signal switch unit 7 performed when a positive or negative output value is output, and FIG. 9 illustrates operation of the RZ signal switch unit 8 performed when the output value is 0 in the RZ section.

Referring to FIG. 8, if the value of the final switch pair input data FD is different from the value of the inverse final switch pair input data FDB, the output signal switch unit 7 allows a current to flow as one of FD switches 71 and 72 of the output signal switch unit 7 is turned on. The output value from the output signal switch unit 7 becomes the output value of one of the DAC units, and is added to the output value of the next DAC unit to provide an output value of the DAC.

Referring to FIG. 9, the values of the final switch pair input data FD and the inverse final switch pair input data FDB are all set to 1. If the reset signal Rst is provided as 0, RZ switches 81 and 82 of the RZ signal switch unit 8 are all turned on, and the two currents are cancelled, and thus the output value becomes 0. The RZ switches are configured with half the current of the FD switches 71 and 72 (i.e., W/2) because creation of an RZ section causes large fluctuation at node Va.

According to the description given above, it is possible to determine whether to operate RZ, and determine the size of the RZ section when RZ is operated. In addition, all the operations described above may be easily understood with reference to the ideal timing diagram shown in FIG. 12.

Figure 10:
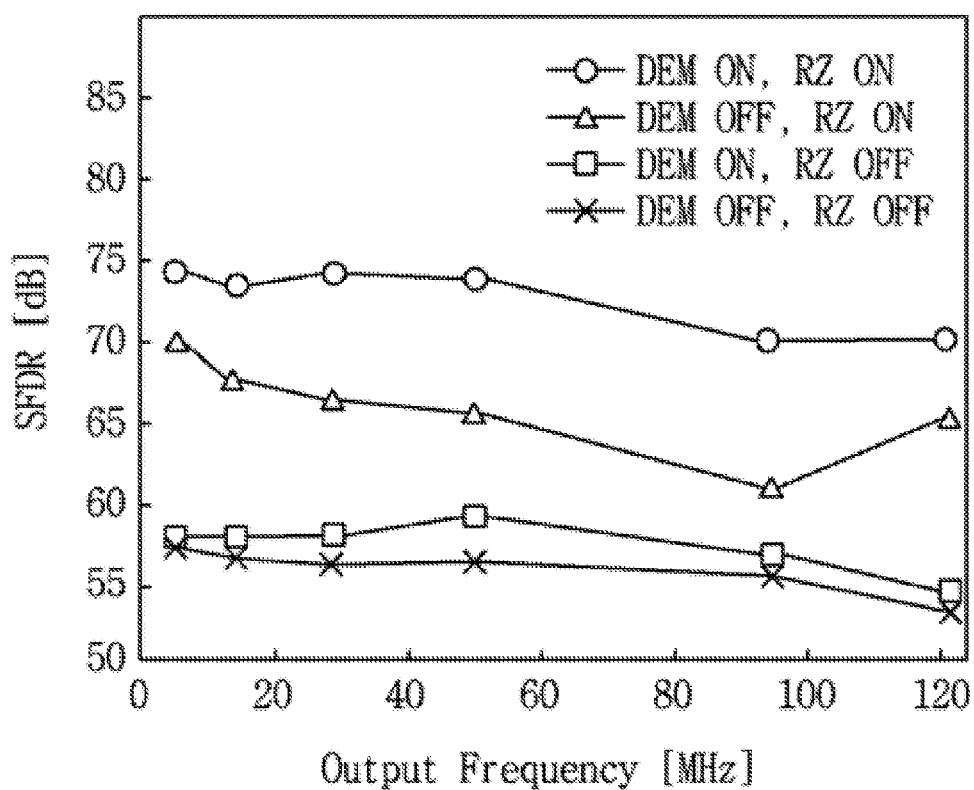
FIG. 10 depicts effects according to operation modes of the DAC.

FIG. 10 shows results of a test for four cases according to whether or not the DEM circuit operates and whether or not RZ is applied. The horizontal axis indicates output frequencies and the vertical axis indicates SFDR. It can be seen from FIG. 10 that a high SFDR can be obtained when RZ is applied while the DEM circuit operates.

FIG. 11 is a table for comparing performances of DACs of comparative examples and an embodiment.

FIG. 11 shows comparison between performances of DACs fabricated according to five different comparative examples including Comparative Example 1. [W.-T. Lin and T.-H. Kuo, "A Low-Spurious Low-Power 12-bit 300 MS/s DAC with 0.1 mm2 in 0.18 μm CMOS Process," *IEEE Electron Devices and Solid-State Circuits Conf. (EDSSC)*, 2013, pp. 1-2.], Comparative Example 2. [J.-H. Chi, S.-H. Chu, and T.-H. Tsai, "A 1.8-V 12-Bit 250-MS/s 25-mW Self-calibrated DAC," in *Proc. IEEE Eur. Solid-State Circuits Conf. (ESSCIRC)*, 2010, pp. 222-225.], Comparative Example 3. [G. Engel, S. Kuo, and S. Rose, "A 14b 3/6 GHz Current-Steering RF DAC in 0.18 um CMOS with 66 dB ACLR at 2.9 GHz," in *IEEE ISSCC Dig. Tech. Papers*, February 2012, pp. 458-460.], Comparative Example 4. [W.-H. Tseng, C.-W. Fan, and J.-T. Wu, "A 12-Bit 1.25-GS/s DAC in 90 nm CMOS With >70 dB SFDR up to 500 MHz," *IEEE J. Solid-State Circuits*, vol. 46, no. 12, pp. 2845-2856, December 2011.], and Comparative Example 5. [W.-T. Lin, H.-Y. Huang, and T.-H. Kuo, "A 12-bit 40 nm DAC Achieving SFDR>70 dB at 1.6 GS/s and IMD<−61 dB at 2.8 GS/s With DEMDRZ Technique," *IEEE J. Solid-State Circuits*, vol. 49, no. 3, pp. 708-717, March 2014.] and an embodiment of the present invention.

Referring to FIG. 11, with a configuration of the embodiment, power consumption is low and a large swing range is implementable. Thereby, the output value may be adjusted in a large scale, and characteristics of high FoM1/FoM2/FoM3 may be obtained.

In addition, the RZ section may be minimized. According, signal loss of the output value may be minimized.

Figure 13:
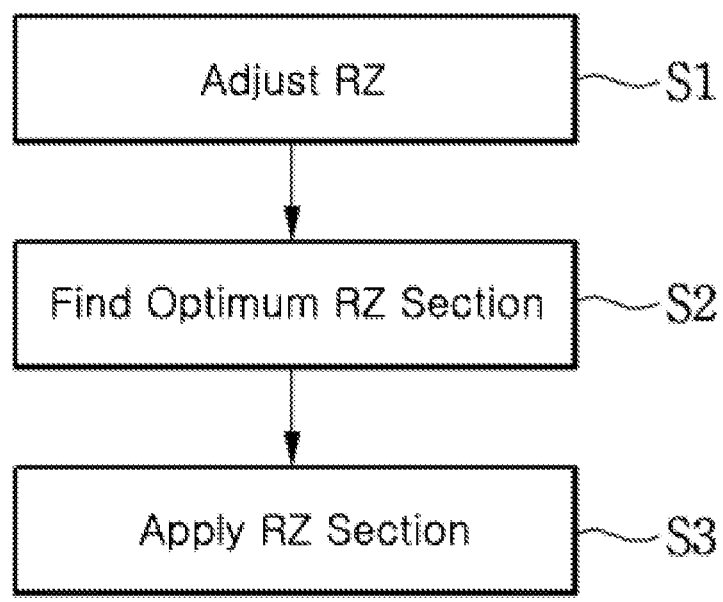
FIG. 13 illustrates a method for using a digital-to-analog converter according to an embodiment.

FIG. 13 illustrates a method for using a digital-to-analog converter according to an embodiment. In this embodiment, the analog to digital converter described above is employed. For details which are not described below, refer to the description given above.

Referring to FIG. 13, the DAC according to an embodiment is applied to a digital device, thereby adjusting operation of RZ or the RZ section (S1). Herein, adjustment of the RZ operation may be performed by setting the RZ controller signal (RZ_CTRL) to 0 or 1. Adjustment of the RZ section may be performed by adjusting the delay adjustment signal (DELAY_RANGE). By performing the RZ adjustment process, an optimum RZ section may be found (S2). The optimum RZ section may be an RZ section in which a performance factor such as SFDR is optimized, and signal loss in the output value is minimized. After the optimum RZ section is found, the DAC may operate by applying the RZ section. Thereby, the digital device to which the DAC is applied may operate in an optimum state.

The established RZ section and operation of RZ may be changed by re-applying the method for using the DAC.

According to embodiments of the present invention, by utilizing the RZ technique, distortion of the DAC output may be attenuated, loss of the output may be minimized, and a product may be implemented with a simple circuit configuration. In addition, an optimum RZ section may be established according to a device to which the DAC is applied, and an optimum RZ technique may be applied to various environments (including an environment where RZ is not performed) as the RZ section changes. Accordingly, application to digital devices may be strongly recommended.

What is claimed is:

1. A digital-to-analog converter (DAC) comprising:
   a clock driver for controlling a clock signal to provide an inverse delay clock signal to allow at least selective adjustment of a return to zero (RZ) section; and
   a DAC core comprising at least two DAC units for receiving a digital input value, the clock signal and the inverse delay clock signal and providing an analog output value.

2. The DAC according to claim 1, wherein the clock driver adjusts enablement and disablement of RZ.

3. The DAC according to claim 1, wherein the DAC core comprises:
   an RZ flip-flop for outputting 0 as a flip-flop output signal and an inverse flip-flop output signal such that the RZ section is established when both the clock signal and the inverse delay clock signal are 1;
   a switch driver for outputting 0 as a reset signal when both the flip-flop output signal and the inverse flip-flop output signal are 0; and
   an output unit comprising an RZ signal switch unit and an output signal switch unit, the RZ signal switch unit setting an output value to 0 in a section having the reset signal equal to 0 and the output signal switch unit providing a positive or negative output value in a section having the reset signal unequal to 0.

4. The DAC according to claim 1, wherein the RZ section is adjusted by a signal constituted in 4 bits.

5. The DAC according to claim 1, wherein the digital input value is obtained by converting an original digital input value through a dynamic element matching (DEM) circuit,
   wherein the DEM circuit is adjustable to be turned on and off.

6. A digital-to-analog converter (DAC) unit comprising:
   a return to zero (RZ) flip-flop for receiving a clock signal and an inverse delay clock signal delayed by an RZ section by converting the clock signal and outputting 0 as a flip-flop output signal and an inverse flip-flop output signal in the RZ section;
   a switch driver for outputting 0 as a reset signal when both the flip-flop output signal and the inverse flip-flop output signal are 0; and
   an output unit for outputting an output value of 0 in a section having the reset signal equal to 0 and outputting a positive or negative output value in a section having the reset signal unequal to 0.

7. The DAC unit according to claim 6, wherein the RZ flip-flop is configured as hardware.

8. The DAC unit according to claim 7, wherein the RZ flip-flop comprises:
   a sense amplifier for outputting, when the clock signal corresponds to a rising edge, logic values of a digital input value and an inverse digital input value as a reset set signal and a sensing set signal and maintaining the logic values until a rising edge of a next clock signal appears; and
   an RZ latch for outputting 0 as the flip-flop output signal and the inverse flip-flop output signal when the clock signal and the inverse delay clock signal are 1, and outputting, when any one of the clock signal and the inverse delay clock signal is not 1, the flip-flop output signal and the inverse flip-flop output signal such that the flip-flop output signal complies with a value of the reset set signal, and the inverse flip-flop output signal complies with a value of the sensing set signal.

9. The DAC unit according to claim 6, wherein the switch driver comprises an inverter for inverting the flip-flop output signal and the inverse flip-flop output signal and outputting final switch pair input data and inverse final switch pair input data.

10. The DAC unit according to claim 9, wherein the switch driver comprises:
    two reset switches having a power supply as a source, having the final switch pair input data and the inverse final switch pair input data as gates thereof, and having a reset signal output terminal for outputting the reset signal connected to a drain.

11. The DAC unit according to claim 6, further comprising:
    an RZ switch unit for outputting an output value of 0 in a section having the reset signal equal to 0; and
    an output signal switch unit for outputting a positive or negative output value in a section having the reset signal unequal to 0.

12. The DAC unit according to claim 11, wherein the RZ switch unit and the output signal switch unit are connected in parallel.

13. A method of operating a digital-to-analog converter (DAC) comprising a clock driver and a DAC core, the method comprising:
    controlling, by the clock driver, a clock signal to provide an inverse delay clock signal for allow at least selective adjustment of a return to zero (RZ) section;
    receiving, by the DAC core comprising at least two DAC units, the clock signal, the inverse delay clock signal, and a digital input value;
    adjusting, by the DAC core, the RZ section based on the received clock signal and the received inverse delay clock signal; and
    converting, by the DAC core, the digital input value based on the adjusted RZ section to output an analog output value.

14. The method according to claim 13, wherein the RZ section is adjusted by comparing the clock signal and the inverse delay clock signal.

15. The method according to claim 13, wherein a duration of time when both the clock signal and the inverse delay clock signal are 1 is the RZ section.

* * * * *